US008758066B2

(12) United States Patent
Zhou et al.

(10) Patent No.: US 8,758,066 B2
(45) Date of Patent: Jun. 24, 2014

(54) ELECTRICAL CONNECTOR WITH INSULATION MEMBER

(75) Inventors: Jiachun Zhou, Gilbert, AZ (US); Caiyun Yang, Jiangsu Province (CN)

(73) Assignee: Interconnect Devices, Inc., Kansas City, KS (US)

( * ) Notice: Subject to any disclaimer, the term of this patent is extended or adjusted under 35 U.S.C. 154(b) by 22 days.

(21) Appl. No.: 13/365,931

(22) Filed: Feb. 3, 2012

(65) Prior Publication Data

US 2013/0203298 A1 Aug. 8, 2013

(51) Int. Cl.
*H01R 13/24* (2006.01)

(52) U.S. Cl.
USPC .......... 439/700

(58) Field of Classification Search
USPC .......... 439/700, 824; 324/755.05
See application file for complete search history.

(56) References Cited

U.S. PATENT DOCUMENTS 5,576,631 A 11/1996 Stowers et al.
7,116,121 B1 10/2006 Holcombe et al.
7,456,645 B2 * 11/2008 Yoshida et al. .......... 324/755.02
8,231,416 B2 * 7/2012 Johnston et al. .......... 439/824
2011/0039457 A1 * 2/2011 Johnston et al. .......... 439/816

FOREIGN PATENT DOCUMENTS

JP 2007-248133 9/2007
WO WO 02/07265 A1 1/2002

OTHER PUBLICATIONS

International Search Report and Written Opinion issued in PCT International Application No. PCT/US2013/022893, mailed May 22, 2013 (9 pages total).

* cited by examiner

*Primary Examiner* — Phuong Dinh
(74) *Attorney, Agent, or Firm* — Finnegan, Henderson, Farabow, Garrett & Dunner LLP

(57) ABSTRACT

A contact probe and method of forming the same are provided, where the contact probe can include a shell including a body having a shell cavity. The contact probe can also include at least one plunger slidably received in the shell cavity and extending through at least one opening in at least one end of the shell. The contact probe can further include a biasing device configured to exert a biasing force on the at least one plunger and at least one insulation member including an insulative material. The at least one insulation member can be disposed on at least a portion of an outer surface of at least one of: the shell and the at least one plunger.

43 Claims, 10 Drawing Sheets

ELECTRICAL CONNECTOR WITH INSULATION MEMBER

TECHNICAL FIELD

The present disclosure relates generally to an electrical connector, and more particularly, to materials, components, and methods directed to the fabrication and use of an electrical connector with an insulation member.

BACKGROUND

In the electronics and semiconductor industries, systems used to test and qualify integrated circuit (IC) chips during the manufacturing process are conventionally referred to as "test systems." FIGS. 1 and 2 depict a test system 100. The test system 100 includes an electrical connector for providing an electrical connection between an IC chip 110 (which can be referred to as a "Device Under Test" or "DUT") and a printed circuit board (PCB).

The test system 100 can include a socket body 120 defining a plurality of cavities 121. Each cavity of the plurality of cavities 121 can receive one of a plurality of spring probes 130. The test system 100 can also include a socket retainer 124.

FIGS. 3-5 depict the spring probe 130. As shown in FIG. 3, the spring probe 130 can include a shell 331, a first plunger 340, and a second plunger 350. The shell 331 can be tubular, and at least a portion of the first and second plungers 340 and 350 can be disposed within the shell 331. The socket body 120 and the socket retainer 124 can position the spring probes 130 such that the first plungers 340 electrically connect to conductive pads on the IC chip 110, and the second plungers 350 electrically connect to conductive pads on the PCB.

As shown in FIG. 4, the first plunger 340 can include a tip portion 441 that extends away from the shell 331. The first plunger 340 can also include a flange 443 that abuts the end of the shell 331 so that when a force is applied to the first plunger 340 toward the shell 331, the flange 443 pushes against the end of the shell 331 so that the first plunger 340 and the shell 331 move together. The second plunger 350 can include a tip portion 451 that extends outwardly from the shell 331.

As shown in FIG. 5, the first plunger 340 can also include a tail portion 542 inserted into the shell 331 and attached to the shell 331 (e.g., using adhesive) so that the first plunger 340 and the shell 331 move together. The flange 443 can be disposed between the tip portion 441 and the tail portion 542. The second plunger 350 can also include a tail portion 552 inserted into the shell 331. The end of the shell 331 that receives the second plunger 350 can be crimped to retain the tail portion 552 of the second plunger 350 in the shell 331 so that the tail portion 552 is slidable within the shell 331. The tip portion 451 can extend outwardly from the shell 331 away from the tail portion 552.

A spring 560 can be disposed between the two plungers 340 and 350. The spring 560 can be capable of exerting a force against each plunger 340 and 350 to bias the second plunger 350 outwardly from the shell 331 and away from the first plunger 340. The second plunger 350 can also be depressed inwardly into the shell 331 under a force directed inward against the spring 560. Thus, the first plunger 340 can be connected to the shell 331 to move with the shell 331, and the second plunger 350 can be slidable with respect to the shell 331.

FIGS. 6 and 7 depict a spring probe 630 in which both plungers are slidable with respect to the shell 331. As shown in FIG. 6, the spring probe 630 can include a shell 631, a first plunger 640, and the second plunger 350. The shell 631 can be tubular, and at least a portion of the first and second plungers 640 and 350 are disposed within the shell 331. The spring probe 630 can be positioned in the socket body 120 and the socket retainer 124 such that the first plungers 640 electrically connect to conductive pads on the IC chip 110, and the second plungers 350 electrically connect to conductive pads on the PCB.

The first plunger 640 can include a tip portion 641 that extends away from the shell 631. As shown in FIG. 7, the first plunger 640 can also include a tail portion 742 inserted into the shell 631. The end of the shell 631 that receives the first plunger 640 can be crimped to retain the tail portion 742 of the first plunger 640 in the shell 631 so that the tail portion 742 is slidable within the shell 631. The tip portion 641 can extend outwardly from the shell 631 away from the tail portion 742.

The spring 560 can be disposed between the two plungers 640 and 350. The spring 560 can be capable of exerting a force against each plunger 640 and 350 outwardly from the shell 631. Also, each of the plungers 640 and 350 can be depressed inwardly into the shell 631 under a respective force directed inward against the spring 560. Thus, the first and second plungers 640 and 350 can be slidable with respect to the shell 631.

The spring probe 130 or 630 can be formed from conductive materials, such as copper alloy coated with gold, so that an electrical connection is formed between the first plunger 340 or 640, the second plunger 350, and the shell 331 or 631. The socket body 120 and the socket retainer 124 can be formed from insulative plastic composite to insulate each of the plurality of spring probes 130 or 630 from the others.

FIGS. 8-10 depict a conventional test system 800 where a portion of the system can provide a coaxial structure. The test system 800 can include an electrical connector for providing an electrical connection between the IC chip 110 and the PCB (not shown). The test system 800 can include a top socket layer 820 defining a plurality of cavities 821, a center socket layer 822 defining a plurality of cavities 823, and a bottom socket layer 824 defining a plurality of cavities 825. The top socket layer 820 and the bottom socket layer 824 can be configured to retain a plurality of the spring probes 830 within the cavities 823 in the center socket layer 822. Also, each cavity 821 can align with one of the cavities 823 and one of the cavities 825 to accommodate one of the plurality of the spring probes 830. The spring probes 830 can be similar to either spring probes 130 or 630 described above, and can each include a shell 1031, a first plunger 1040, and a second plunger 1050.

To provide a coaxial structure, the center socket layer 822 can be formed of metal and electrically grounded. The impedance will be dependent on a diameter D1 of the inner surface of the cavities 823 of the center socket layer 822 and a diameter D2 of the outer surface of the shell 1031 of the spring probe 830.

The top socket layer 820 and the bottom socket layer 824 can be constructed from insulative plastic composite material. The top socket layer 820 and the bottom socket layer 824 do not form a coaxial structure when combined with the spring probes 130 or 630 as they are formed from insulative materials.

SUMMARY

In one aspect, the present disclosure is directed to a contact probe. The contact probe can include a shell including a body having a shell cavity. The contact probe can also include at least one plunger slidably received in the shell cavity and extending through at least one opening in at least one end of the shell. The contact probe can further include a biasing device and at least one insulation member including an insulative material, the biasing device being configured to exert a biasing force on the at least one plunger. The at least one insulation member can be disposed on at least a portion of an outer surface of at least one of: the shell and the at least one plunger.

In another aspect, the present disclosure is directed to an electrical connector assembly. The electrical connector assembly can include a socket shell including a body having a socket cavity. The electrical connector assembly can also include a contact probe including a contact probe shell disposed in the socket cavity. The contact probe shell can include a body having a shell cavity. The contact probe can also include at least one plunger slidably received in the shell cavity and extending through at least one opening in at least one end of the contact probe shell. The contact probe can further include a biasing device disposed in the shell cavity and configured to exert a biasing force on the at least one plunger. The contact probe can also include at least one insulation member including an insulative material, where the insulation member is disposed in the socket cavity. The at least one insulation member can be disposed on at least a portion of an outer surface of at least one of: the contact probe shell and the at least one plunger.

In a further aspect, the present disclosure is directed to method of forming an electrical connector. The method can include forming a contact probe. The contact probe can be formed by inserting at least one plunger and a biasing device into a shell cavity in a body of a shell so that a tail of the at least one plunger is slidably received in the shell cavity and the biasing device is configured to bias a tip of the at least one plunger away from the shell cavity. The method can also include disposing at least one insulation member on at least a portion of an outer surface of at least one of: the shell and the at least one plunger. The at least one insulation member can include an insulative material.

Additional features and advantages will be set forth in part in the description which follows, being apparent from the description of or learned by practice of the disclosed embodiments. The features and advantages will be realized and attained by means of the elements and combinations particularly pointed out in the appended claims. It is to be understood that both the foregoing general description and the following detailed description are exemplary and explanatory only and are not restrictive of the scope of the embodiments, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

DETAILED DESCRIPTION

Reference will now be made in detail to exemplary embodiments of the invention, examples of which are illustrated in the accompanying drawings. Wherever possible, the same reference numbers will be used throughout the drawings to refer to the same or like parts.

According to certain embodiments, an electrical connector or other interconnector can transmit electrical signals between various devices, such as between an IC chip and a PCB, main circuit board, motherboard, etc. The electrical connectors disclosed herein can be used in a variety of applications, such as, but not limited to, electronics and semiconductor applications. For example, according to an exemplary embodiment, the electrical connector can be provided in a test system or other electrical connector assembly for testing an IC chip. In the test system, the electrical connector can electrically connect the IC chip to a PCB used for testing the IC chip.

Figure 1:
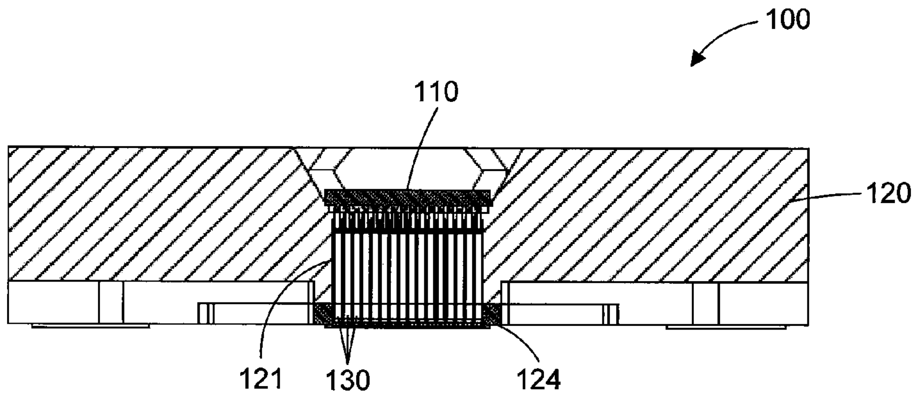
FIG. 1 is a cross-sectional view of a conventional test system.
Figure 2:
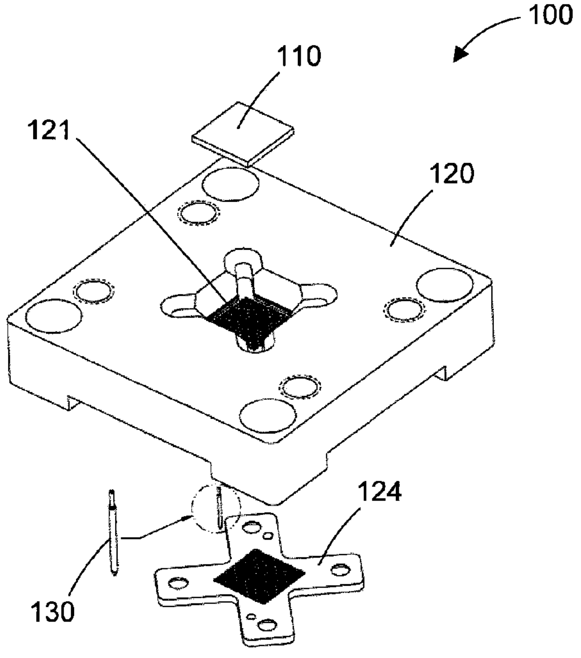
FIG. 2 is an exploded perspective view of the test system of FIG. 1.
Figure 3:
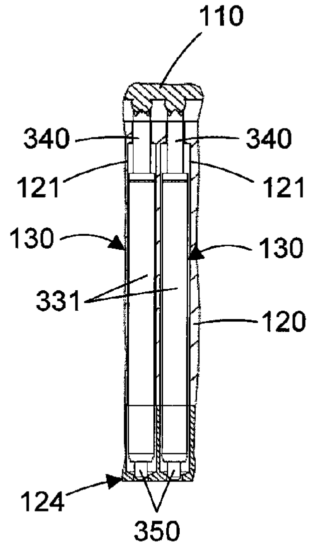
FIG. 3 is a detailed view of a portion of the test system of FIG. 1.
Figure 4:
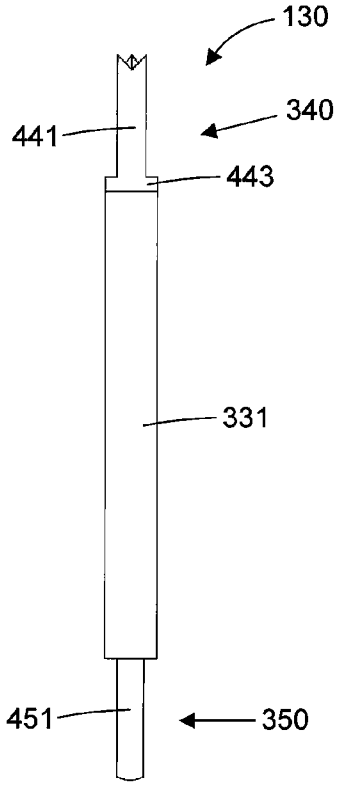
FIG. 4 is a side view of a spring probe.
Figure 5:
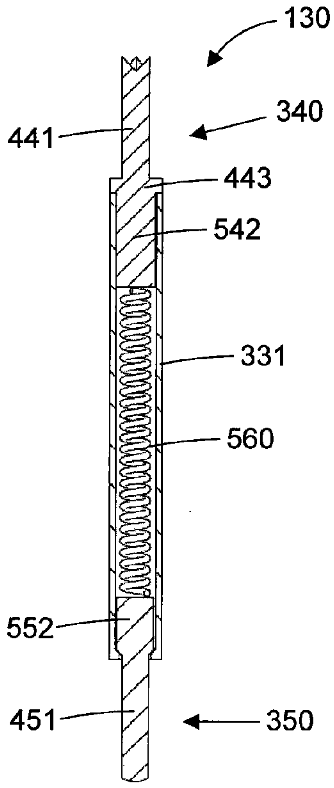
FIG. 5 is a cross-sectional view of the spring probe of FIG. 4.
Figure 6:
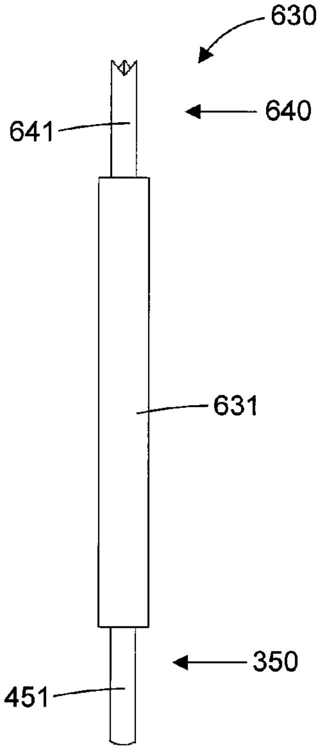
FIG. 6 is a side view of another spring probe.
Figure 7:
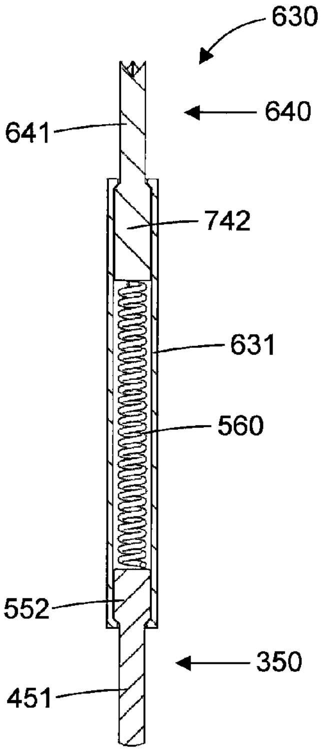
FIG. 7 is a cross-sectional view of the spring probe of FIG. 6.
Figure 8:
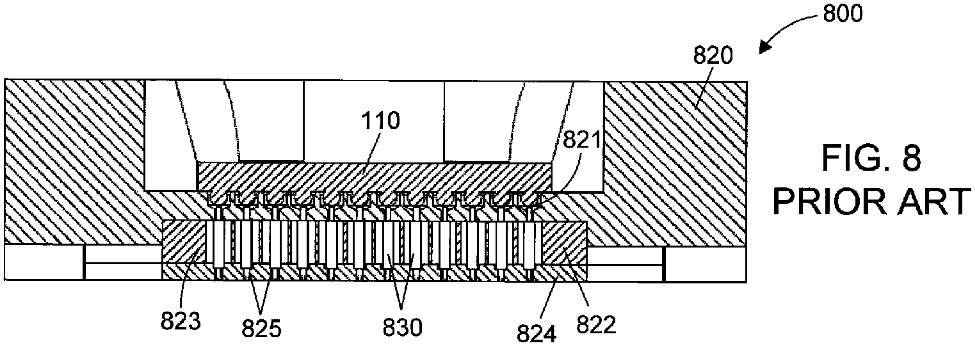
FIG. 8 is a cross-sectional view of another conventional test system.
Figure 9:
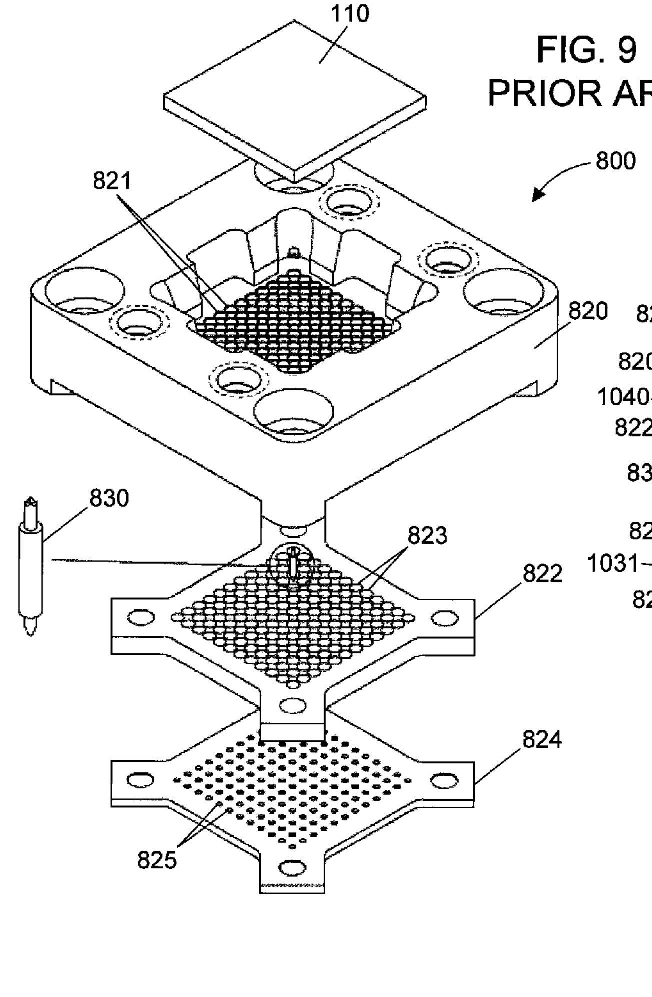
FIG. 9 is an exploded perspective view of the test system of FIG. 8.
Figure 10:
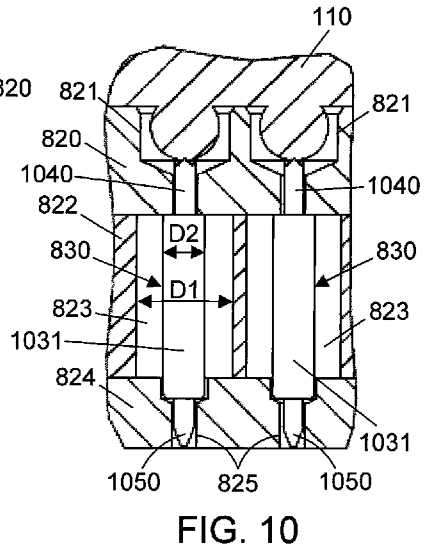
FIG. 10 is a detailed view of a portion of the test system of FIG. 8.
Figure 11:
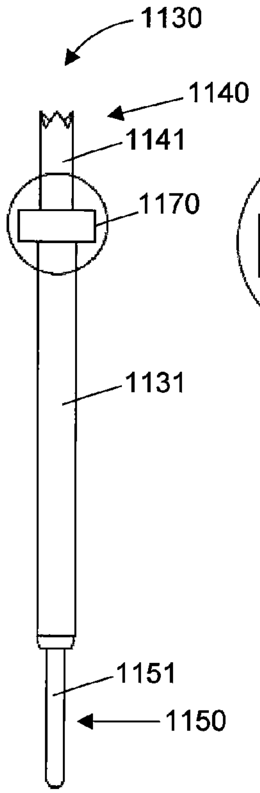
FIG. 11 is a side view of a contact probe, according to an exemplary embodiment.

FIGS. 11-16 show a contact probe 1130 forming an electrical connection, according to an exemplary embodiment. As shown in FIG. 11, the contact probe 1130 can include a shell 1131, a first plunger 1140 located at a first end of the shell 1131, and a second plunger 1150 located at a second end of the shell 1131. The shell 1131 can be tubular (e.g., cylindrical or having a cross-section with a shape, such as a circular, oval, square, rectangular, or other shape). At least a portion of the first and second plungers 1140 and 1150 can be disposed within the shell 1131 as described below.

The first plunger 1140 can include a tip portion 1141 that extends outwardly from the shell 1131, and the tip portion 1141 can be configured to contact and electrically connect to conductive pads of a DUT, e.g., on an IC chip. The first plunger 1140 can be attached to the shell 1131 so that the first plunger 1140 and the shell 1131 move together. For example, the first plunger 1140 can include a tail portion (not shown) inserted into the shell 1131 and attached to the shell 1131 (e.g., using adhesive, by deforming the shell 1131 (e.g., by using a punch), etc.) so that the first plunger 1140 and the shell 1131 move together.

The second plunger 1150 can also include a tip portion 1151 that extends outwardly from the shell 1131, and the tip portion 1151 is configured to contact and electrically connect to conductive pads, e.g., on a PCB. The second plunger 1150 can also include a tail portion (not shown) inserted into the shell 1131. The end of the shell 1131 that receives the second plunger 1150 can be crimped to retain the tail portion of the second plunger 1150 in the shell 1131 so that the tail portion is slidable within the shell 1131. The tip portion 1151 extends outwardly from the shell 1131 away from the tail portion.

A spring (not shown) can be disposed between the two plungers 1140 and 1150. The spring can be capable of exerting a force against each plunger 1140 and 1150 to bias the second plunger 1150 outwardly from the shell 1131 and away from the first plunger 1140. The second plunger 1150 can also be depressed inwardly into the shell 1131 under a force directed inward against the spring. Thus, in the embodiment shown in FIGS. 11-16, the first plunger 1140 is connected to the shell 1131 to move with the shell 1131, and the second plunger 1150 is slidable with respect to the shell 1131.

The first plunger 1140, the second plunger 1150, and the shell 1131 can be formed of conductive materials (e.g., copper alloy coated with gold) so that an electrical connection is formed between the first plunger 1140, the second plunger 1150, and the shell 1131.

An insulation member 1170 can be connected to the first plunger 1140 and/or the shell 1131. In FIGS. 11-16, the insulation member 1170 is depicted as surrounding the first plunger 1140 and adjacent to the shell 1131. In alternative embodiments consistent with this disclosure, the insulation member 1170 can surround both the first plunger 1140 and the shell 1131 or just the shell 1131. In an embodiment, the insulation member 1170 can be a ring formed of an insulative material, such as polytetrafluoroethylene (PTFE) (conventionally known, for example, by the Du Pont brand name Teflon®) or other nonconductive material, such as plastic, polymer, rubber, etc. The insulation member 1170 can have an outer surface having a peripheral dimension (e.g., an outer diameter) that is greater than a peripheral dimension (e.g., outer diameter) of an outer surface of the first plunger 1140 and/or the shell 1131. The outer surface of the insulation member 1170 can have a similar shape (but larger) as an outer surface of the first plunger 1140 and/or the shell 1131 (e.g., having a cross-section with a shape, such as a circular, oval, square, rectangular, or other shape). In an exemplary embodiment, the insulation member 1170 can have a circular outer cross-section and an axis that is substantially parallel to an axis of the first plunger 1140 and/or the shell 1131. Also, the insulation member 1170 can have end surfaces that are substantially perpendicular to the axis of the insulation member 1170, the first plunger 1140, and/or the shell 1131. The dimensions of the insulation member 1170 and of the shell 1131 and/or the tip portion 1141 can be determined based on a desired coaxial structure of the test system as described below.

Figure 12:
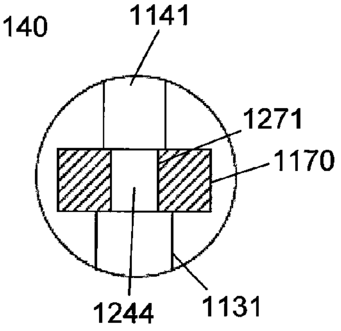
FIG. 12 is a detailed view of a portion of the contact probe of FIG. 11.

FIG. 12 shows a cross-section of the insulation member 1170 in an embodiment. The insulation member 1170 can include a through-hole or opening 1271 configured to allow the insulation member 1170 to be disposed on the first plunger 1140 and/or the shell 1131. As depicted in FIG. 12, the insulation member 1170 can be disposed on an outer surface of the tip portion 1141 of the first plunger 1140. The tip portion 1141 can include a narrowed section 1244 on the outer surface thereof for positioning and receiving the insulation member 1170. The narrowed section 1244 can be a cut or groove formed in at least a portion of the periphery of a section of the tip portion 1141. In the depicted embodiment, the narrowed section 1244 can be a U-shaped cut that extends around the entire periphery of a section of the tip portion 1141. Alternatively, the cut or groove can have a cross-section with a different shape, and/or the cut or groove can extend only around a portion (e.g., a majority, at least half, less than half, etc.) of the periphery of the section of the tip portion 1141. Alternatively, the narrowed section 1244 can be formed on an outer surface of the shell 1131 and/or on another outer surface of the first plunger 1140 (e.g., an outer surface of a portion connected to the tip portion 1141). To position the insulation member 1170 on the tip portion 1141 of the first plunger 1140, the free end of the tip portion 1141 (opposite the tail portion) can be inserted through the opening 1271 in the insulation member 1170 until the insulation member 1170 is seated in the narrowed section 1244.

Instead of (or in addition to) providing the narrowed section 1244 for holding the insulation member 1170 in place, the insulation member 1170 can be held in position due to a compression fit of the insulation member 1170 on the outer surface of the first plunger 1140 and/or the shell 1131. The insulation member 1170 can be formed of a resilient material, and can be connected to the outer surface of the first plunger 1140 and/or the shell 1131 due to a radially compressive force exhibited by the insulation member 1170 when pulled onto the first plunger 1140 and/or the shell 1131. For example, the opening 1271 of the insulation member 1170 can have a smaller inner dimension (e.g., inner diameter) than an outer dimension (e.g., outer diameter) of the tip portion 1141. The free end of the tip portion 1141 can be inserted through the opening 1271 in the insulation member 1170, thereby causing the insulation member 1170 to expand or stretch to fit around the tip portion 1141. The elasticity of the insulation member 1170 can provide a compressive radial pressure or force on the tip portion 1141 such that the insulation member 1170 can be held in place on the tip portion 1141. Alternatively, or in addition to the method(s) described above, the insulation member 1170 can be held in position using adhesive or other attachment methods.

Figure 13:
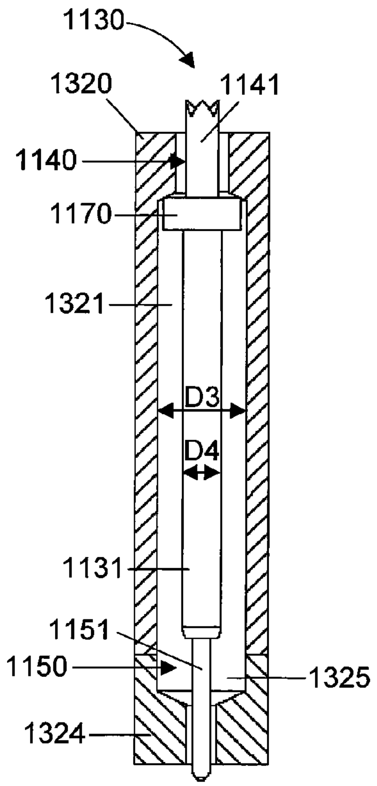
FIG. 13 is a cross-sectional view of a portion of a test system including the contact probe of FIG. 11.
Figure 14:
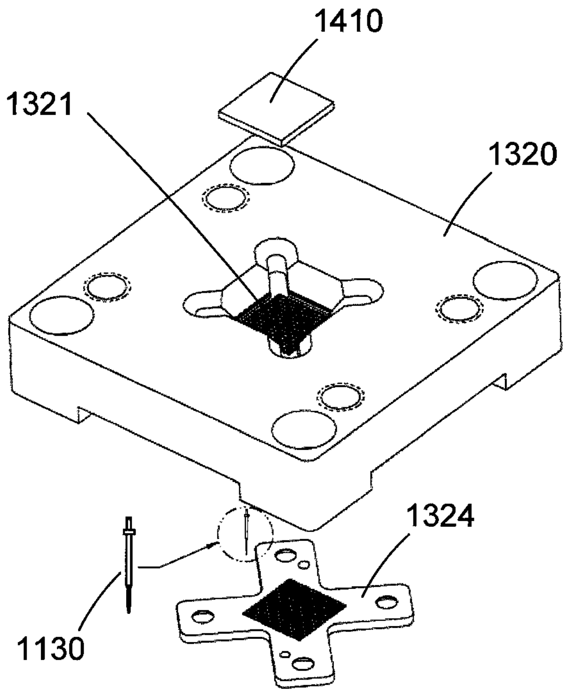
FIG. 14 an exploded perspective view of the test system of FIG. 13.

FIGS. 13 and 14 show the contact probe 1130 positioned in a socket (or socket shell) assembly including a top portion, such as a socket body 1320, and a bottom portion, such as a socket retainer 1324, to form an electrical connector assembly. The socket body 1320 can define a plurality of cavities 1321. The cavities 1321 can each receive one of a plurality of the contact probes 1130. The socket retainer 1324 can be configured to retain the plurality of contact probes 1130 within the respective cavities 1321. The socket retainer 1324 can also define cavities 1325 corresponding to the cavities 1321 of the socket body 1320 so that the cavities 1321 in the socket body 1320 can align with the cavities 1325 in the socket retainer 1324. The contact probes 1130 can be held within the corresponding cavities 1321 and 1325 in an array.

Portions of the socket assembly (e.g., the socket body 1320 and/or the socket retainer 1324) can be formed from conductive material, such as a metal, e.g., one or more of Al, Mg, Ti, Zr, Cu, Fe and/or an alloy of the same, etc. Alternatively, such portions the socket assembly can be formed from conductive materials (e.g., one or more of Al, Mg, Ti, Zr, Cu, Fe and/or an alloy of the same, etc.) with a layer of insulative material (e.g., a layer or coating of PTFE) formed on an inner surface defining the cavities 1321 and 1325.

Figure 15:
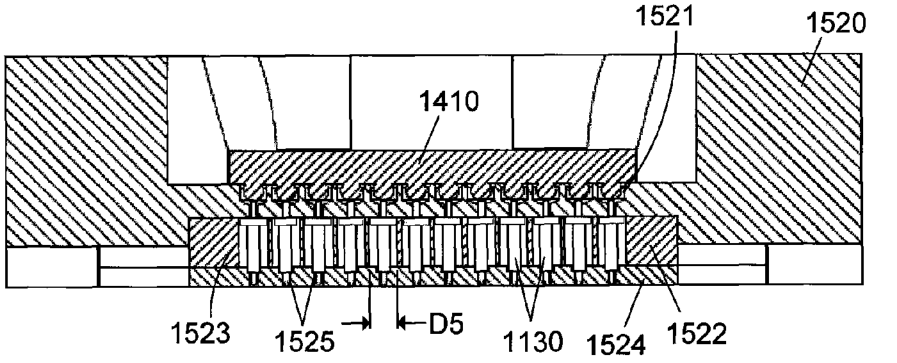
FIG. 15 is a cross-sectional view of a test system including the contact probe of FIG. 11, according to another exemplary embodiment.
Figure 16:
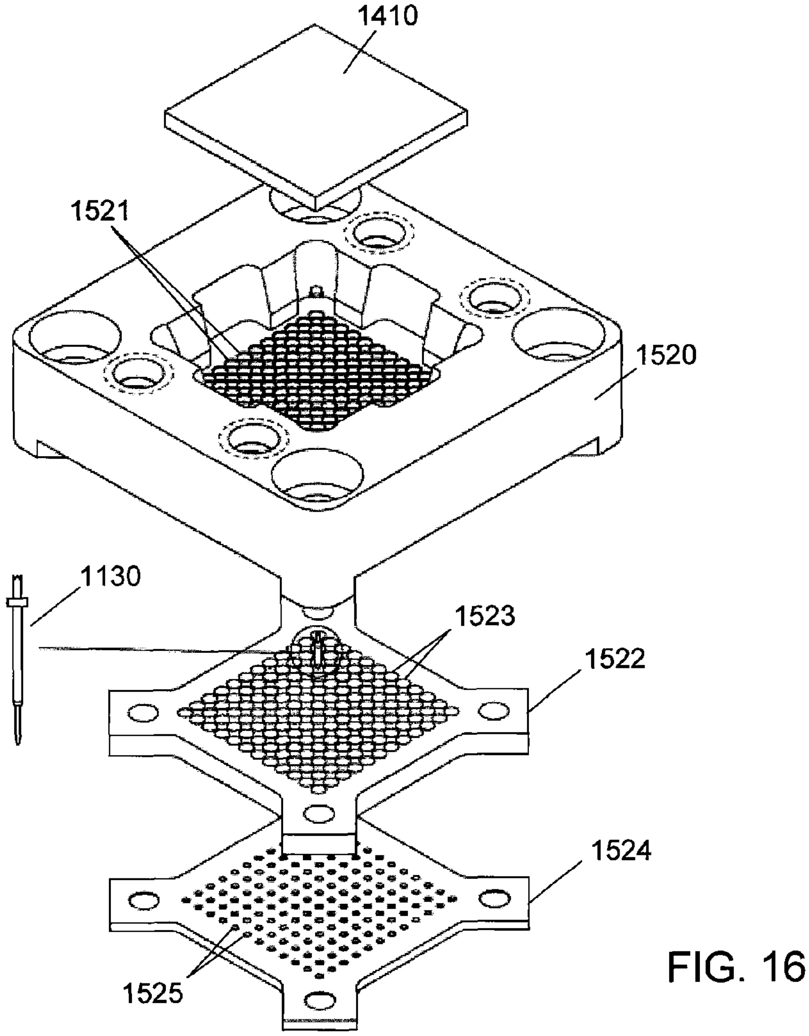
FIG. 16 an exploded perspective view of the test system of FIG. 15.

FIGS. 15 and 16 show the contact probes 1130 positioned in a socket (or socket shell) assembly according to another exemplary embodiment to form an electrical connector assembly. The socket can include a top socket layer 1520 defining a plurality of cavities 1521, a center socket layer 1522 defining a plurality of cavities 1523, and a bottom socket layer 1524 defining a plurality of cavities 1525. The top socket layer 1520 and the bottom socket layer 1524 can be configured to retain a plurality of the contact probes 1130 within the cavities 1523 in the center socket layer 1522. Also, each cavity 1521 can align with one of the cavities 1523 and one of the cavities 1525 to accommodate one of the plurality of the contact probes 1130. The contact probes 1130 can be held within the corresponding cavities 1521, 1523, and 1525 in an array.

Portions of the socket assembly (e.g., the top socket layer 1520, the center socket layer 1522, and/or the bottom socket layer 1524) can be formed from conductive material (e.g., one or more of Al, Mg, Ti, Zr, Cu, Fe and/or an alloy of the same, etc.) with or without a layer of insulative material (e.g., a layer or coating of PTFE) formed on an inner surface defining the cavities 1521, 1523, and 1525. In an embodiment, the center socket layer 1522 can be formed from conductive material, and the top socket layer 1520 and the bottom socket layer 1524 can be formed of insulative material.

The socket assembly (e.g., the socket body 1320 and the socket retainer 1324; or the top socket layer 1520, the center socket layer 1522, and the bottom socket layer 1524) can position the contact probes 1130 such that the first plungers 1140 contact and electrically connect to conductive pads on a DUT (e.g., an IC chip 1410 (FIGS. 14-16)), and the second plungers 1150 contact and electrically connect to conductive pads on a PCB, main circuit board, motherboard, etc. The first plunger 1140, the shell 1131, and the insulation member 1170 can move up and down (axially) with respect to the second plunger 1150 due to external axial forces acting on the first plunger 1140 (e.g., via contact with the IC chip 1410). Likewise, the second plunger 1150 can move up and down (axially) with respect to the first plunger 1140, the shell 1131, and the insulation member 1170 due to external axial forces acting on the second plunger 1150 (e.g., via contact with a PCB). As any of these components (e.g., the first plunger 1140, the shell 1131, and the insulation member 1170 together, the second plunger 1150, etc.) of the contact probe 1130 move, the insulation member 1170 holds the contact probe 1130 substantially straight and in alignment in the socket (e.g., the socket body 1320 and the socket retainer 1324) to prevent the first plunger 1140, the second plunger 1150, and the shell 1131 from contacting the socket assembly.

The number of contact probes 1130 (and corresponding number of cavities 1321 and 1325, or cavities 1521, 1523, and 1525) can depend, e.g., on the desired data rate, the structure of the IC chip, the PCB, or other device being electrically connected by the electrical connector, etc. For example, less than ten to over one thousand contact probes 1130 can be provided.

Figure 17:
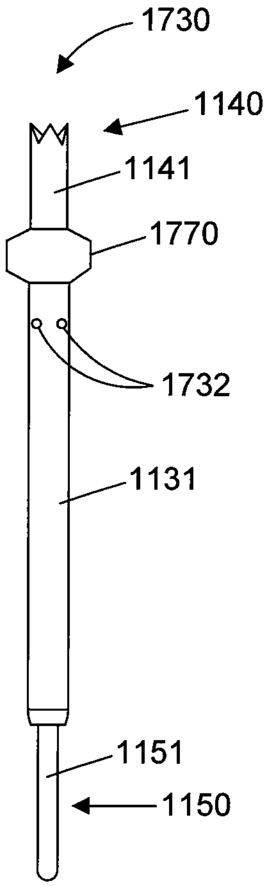
FIG. 17 is a side view of a contact probe, according to another exemplary embodiment.

FIG. 17 shows a contact probe 1730 forming the electrical connection, according to another exemplary embodiment. The contact probe 1730 is similar to the contact probe 1130 shown in FIGS. 11-16 except that an insulation member 1770 (instead of the insulation member 1170) is connected to the first plunger 1140 and/or the shell 1131. The insulation member 1770 can be similar to the insulation member 1170 shown in FIGS. 11-13 except that the insulation member 1770 can have end surfaces that are tapered toward the axial ends of the insulation member 1170.

Also, as shown in FIG. 17, the first plunger 1140 can be attached to the shell 1131 by deforming the shell 1131 so that the first plunger 1140 and the shell 1131 are connected. The tail portion (not shown) of the first plunger 1140 can be inserted into the shell 1131, and a punch or other instrument can be used to press into the portion of the shell 1131 overlapping the tail portion of the first plunger 1140. As a result, the material of the shell 1131 is pressed into the tail portion of the first plunger 1140 to form depressions or holes 1732 in the shell 1131, thereby attaching the shell 1131 to the first plunger 1140.

Figure 18:
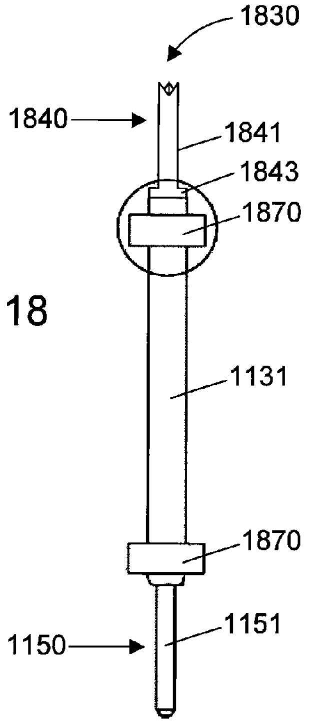
FIG. 18 is a side view of a contact probe, according to another exemplary embodiment.
Figure 19:
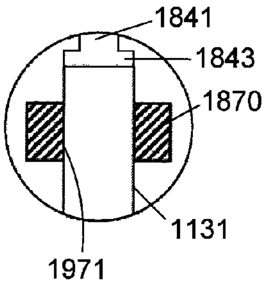
FIG. 19 is a detailed view of a portion of the contact probe of FIG. 18.
Figure 20:
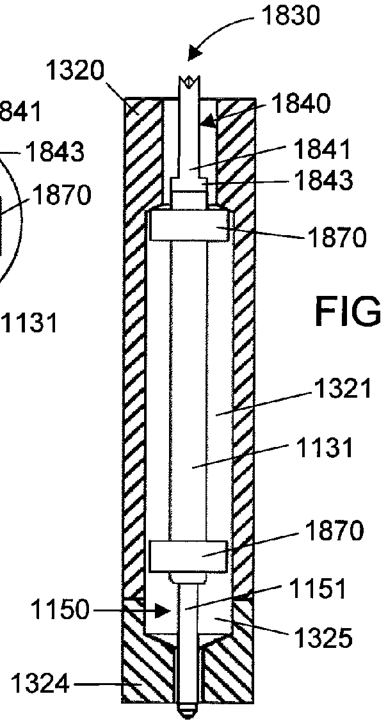
FIG. 20 is a cross-sectional view of a portion of a test system including the contact probe of FIG. 18.

FIGS. 18-20 show a contact probe 1830 forming the electrical connection, according to another exemplary embodiment. The contact probe 1830 can include similar components as the contact probe 1130 (FIG. 11-16) or 1730 (FIG. 17) described above except that the contact probe 1830 includes one or more insulation members disposed on the shell 1131 as described below, e.g., in addition to an insulation member disposed on the first plunger and/or the shell 1131 as described above.

As shown in FIG. 18, the contact probe 1830 includes the shell 1131 and the second plunger 1150 located at the second end of the shell 1131, which are described above and shown in FIGS. 11-13. The contact probe 1830 can include a first plunger 1840, which is located at the first end of the shell 1131. The first plunger 1840 can include a tip portion 1841 that extends outwardly from the shell 1131, and the tip portion 1841 can be configured to contact and electrically connect to conductive pads, e.g., a DUT, such as the IC chip 1410 (FIGS. 14-16). The first plunger 1840 can be attached to the shell 1131 so that the first plunger 1840 and the shell 1131 move together. For example, the first plunger 1840 can include a tail portion (not shown) inserted into the shell 1131 and attached to the shell 1131 (e.g., using adhesive, by deforming the shell 1131 (e.g., by using a punch), etc.) so that the first plunger 1840 and the shell 1131 move together.

The first plunger 1840 can also include a flange 1843 that abuts the end of the shell 1131 so that when a force is applied to the first plunger 1840 toward the shell 1131, the flange 1843 pushes against the end of the shell 1131 so that the first plunger 1840 and the shell 1131 move together. The flange 1843 can be disposed between the tip portion 1841 and the tail portion. Alternatively, the flange 1843 may be omitted.

A spring (not shown) can be disposed between the two plungers 1840 and 1150. The spring can be capable of exerting a force against each plunger 1840 and 1150 to bias the second plunger 1150 outwardly from the shell 1131 and away from the first plunger 1840. The second plunger 1150 can also be depressed inwardly into the shell 1131 under a force directed inward against the spring. Thus, the first plunger 1840 is connected to the shell 1131 to move with the shell 1131, and the second plunger 1150 is slidable with respect to the shell 1131.

One or more insulation members 1870 can be connected to the shell 1131. In the depicted embodiment, two insulation members 1870 are provided. One of the insulation members 1870 can be provided closer to the first end of the shell 1131 and the other insulation member 1870 can be provided closer to the second end of the shell 1131. Alternatively, more than two insulation members 1870 can be provided. The insulation members 1870 can be generally similar in size, shape, and materials as the insulation member 1170 (FIG. 11-13) or 1770 (FIG. 17) described above, except that at least one of the insulation members 1870 is located on the shell 1131 instead of a plunger. In the embodiment shown in FIG. 18, two insulation members are located on the shell 1131, and none are located on the first plunger 1840.

FIG. 19 shows a cross-section of the insulation member 1870 that is closer to the first end of the shell 1131. Similar to the insulation member 1170 (FIG. 11-13) or 1770 (FIG. 17) described above, the insulation member 1870 can include a through-hole or opening 1971 configured to allow the shell 1131 to be inserted into the insulation member 1870, and the insulation member 1870 can be held in position due to a compression fit of the insulation member 1870 on the outer surface of the shell 1131. The insulation member 1870 can be formed of a resilient material, and can be connected to the outer surface of the first plunger 1840 and/or the shell 1131 due to a radially compressive force exhibited by the insulation member 1870 when pulled onto the first plunger 1840 and/or the shell 1131. For example, the opening 1971 of the insulation member 1870 can have a smaller inner dimension (e.g., inner diameter) than an outer dimension (e.g., outer diameter) of the shell 1131. The first end of the shell 1131 can be inserted through the opening 1971 in the insulation member 1870, thereby causing the insulation member 1870 to expand or stretch to fit around the shell 1131. The elasticity of the insulation member 1870 can provide a compressive radial pressure or force on the shell 1131 such that the insulation member 1870 can be held in place on the shell 1131. Alternatively, or in addition to the method(s) described above, the insulation member 1870 can be held in position using adhesive or other attachment methods.

FIG. 20 shows the contact probe 1830 positioned in a socket assembly similar to the socket assembly described above in connection with FIGS. 13 and 14 (e.g., including the socket body 1320 and the socket retainer 1324) to form an electrical connector assembly. Alternatively, the contact probe 1830 can be positioned in a socket assembly similar to the socket assembly described above in connection with FIGS. 15 and 16 (e.g., including the top socket layer 1520, the center socket layer 1522, and the bottom socket layer 1524) to form an electrical connector assembly. The first plunger 1840, the shell 1131, and the insulation member(s) 1870 can move up and down (axially) with respect to the second plunger 1150 due to external axial forces acting on the first plunger 1840 (e.g., via contact with a DUT, such as the IC chip 1410 (FIGS. 14-16)). Likewise, the second plunger 1150 can move up and down (axially) with respect to the first plunger 1840, the shell 1131, and the insulation member(s) 1870 due to external axial forces acting on the second plunger 1150 (e.g., via contact with a PCB). As any of these components (e.g., the first plunger 1840, the shell 1131, and the insulation member(s) 1870 together, the second plunger 1150, etc.) of the contact probe 1830 move, the insulation member(s) 1870 hold the contact probe 1830 substantially straight and in alignment in the socket assembly (e.g., the socket body 1320 and the socket retainer 1324; or the top socket layer 1520, the center socket layer 1522, and the bottom socket layer 1524) to prevent the first plunger 1840, the second plunger 1150, and the shell 1131 from contacting the socket assembly.

Figure 21:
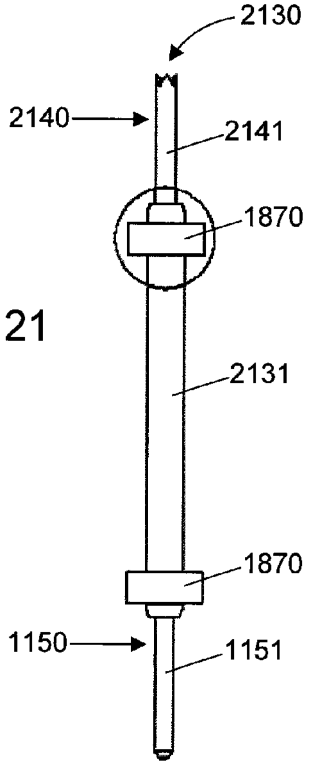
FIG. 21 is a side view of a contact probe, according to another exemplary embodiment.
Figure 22:
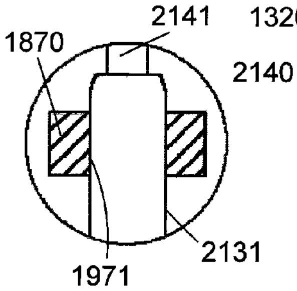
FIG. 22 is a detailed view of a portion of the contact probe of FIG. 21.
Figure 23:
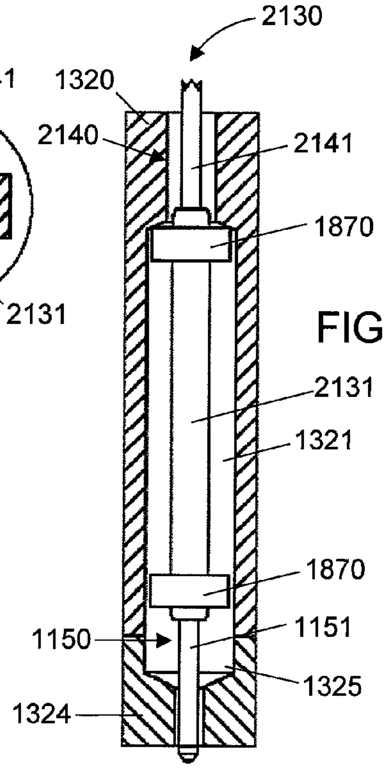
FIG. 23 is a cross-sectional view of a portion of a test system including the contact probe of FIG. 21.

FIGS. 21-23 show a contact probe 2130 forming the electrical connection, according to another exemplary embodiment. The contact probe 2130 can be similar to the contact probe 1830 (FIGS. 18-20) described above except that both plungers of the contact probe 2130 are slidable with respect to the shell as described below.

As shown in FIG. 21, the contact probe 2130 includes a shell 2131 and a first plunger 2140 located at a first end of the shell 2131. The contact probe 2130 can also include the second plunger 1150 (described above and shown in FIGS. 11-13) located at the second end of the shell 2131. The shell 2131 can be similar to the shell 1131 described above and shown in FIGS. 11-13 and 17 except that the shell 2131 slidably receives at least a portion of both the first plunger 2140 and the second plunger 1150.

The first plunger 2140 can include a tip portion 2141 that extends outwardly from the shell 2131, and the tip portion 2141 can be configured to contact and electrically connect to conductive pads, e.g., on a DUT, such as the IC chip 1410 (FIGS. 14-16). The first plunger 2140 can also include a tail portion (not shown) inserted into the shell 2131. The first end of the shell 2131, which receives the first plunger 2140, can be crimped to retain the tail portion of the first plunger 2140 in the shell 2131 so that the tail portion is slidable within the shell 2131. The tip portion 2141 extends outwardly from the shell 2131 away from the tail portion. Accordingly, the first plunger 2140 can be similar to the second plunger 1150 since both plungers 2140 and 1150 include tail portions that are slidably received in the shell 2131.

A spring (not shown) can be disposed between the two plungers 2140 and 1150. The spring can be capable of exerting a force against each plunger 2140 and 1150 outwardly from the shell 2131, and also each of the plungers 2140 and 1150 can be depressed inwardly into the shell 2131 under a respective force directed inward against the spring. Thus, the first and second plungers 2140 and 1150 are slidable with respect to the shell 2131.

One or more of the insulation members 1870 described above and shown in FIGS. 18-20 can be connected to the shell 2131. In the depicted embodiment, two insulation members 1870 are provided. One of the insulation members 1870 can be provided closer to the first end of the shell 2131 and the other insulation member 1870 can be provided closer to the second end of the shell 2131. FIG. 22 shows a cross-section of the insulation member 1870 that is closer to the first end of the shell 2131.

FIG. 23 shows the contact probe 2130 positioned in a socket assembly similar to the socket assembly described above in connection with FIGS. 13 and 14 (e.g., including the socket body 1320 and the socket retainer 1324) to form an electrical connector assembly. Alternatively, the contact probe 2130 can be positioned in a socket assembly similar to the socket assembly described above in connection with FIGS. 15 and 16 (e.g., including the top socket layer 1520, the center socket layer 1522, and the bottom socket layer 1524) to form an electrical connector assembly. The first plunger 2140 can move up and down (axially) with respect to the shell 2131 and the insulation member(s) 1870 due to external axial forces acting on the first plunger 1840 (e.g., via contact with a DUT, such as the IC chip 1410 (FIGS. 14-16)). Likewise, the second plunger 1150 can move up and down (axially) with respect to the shell 2131 and the insulation member(s) 1870 due to external axial forces acting on the second plunger 1150 (e.g., via contact with a PCB). The first and second plungers 2140 and 1150 can move independently from each other, and the shell 2131 and the insulation member(s) 1870 can be held approximately motionless with respect to the socket assembly (e.g., including the socket body 1320 and the socket retainer 1324; or the top socket layer 1520, the center socket layer 1522, and the bottom socket layer 1524) and the plungers 2140 and 1150. As the first plunger 2140 and/or the second plunger 1150 move, the insulation member(s) 1870 hold the shell 2131 substantially straight and in alignment with the socket assembly.

Figure 24:
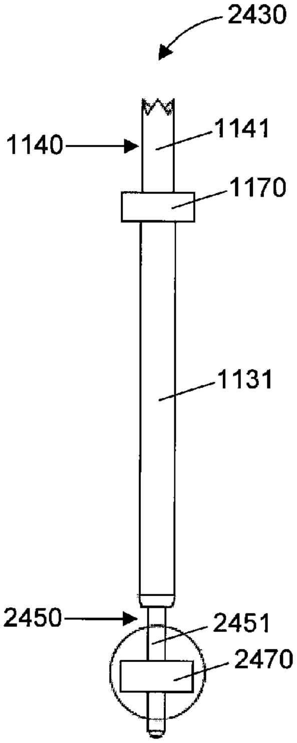
FIG. 24 is a side view of a contact probe, according to another exemplary embodiment.
Figure 25:
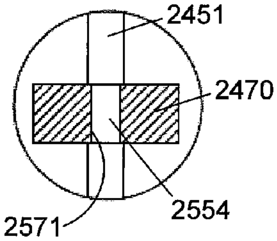
FIG. 25 is a detailed view of a portion of the contact probe of FIG. 24.
Figure 26:
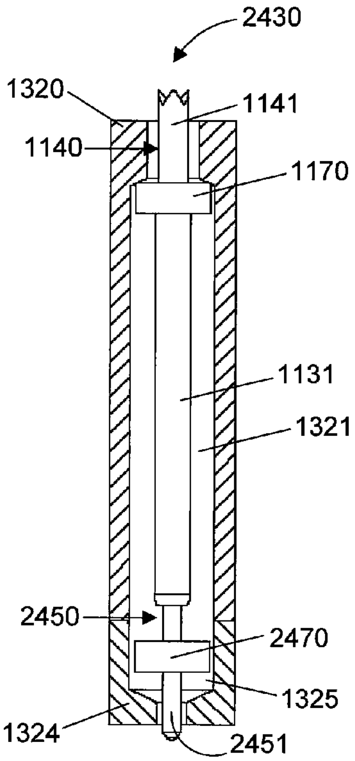
FIG. 26 is a cross-sectional view of a portion of a test system including the contact probe of FIG. 24.

FIGS. 24-26 show a contact probe 2430 forming the electrical connection, according to another exemplary embodiment. The contact probe 2430 can include similar components as the contact probe 1130 (FIG. 11-16) or 1730 (FIG. 17) described above except that the contact probe 2430 includes one or more insulation members disposed on the second plunger as described below.

As shown in FIG. 24, the contact probe 2430 includes the shell 1131 and the first plunger 1140 located at the first end of the shell 1131, which are described above and shown in FIGS. 11-13. As described above, the first plunger 1140 can be attached to the shell 1131 so that the first plunger 1140 and the shell 1131 move together.

The contact probe 2430 includes a second plunger 2450, which is located at the second end of the shell 1131 and which is similar to the second plunger 1150 described above and shown in FIGS. 11, 13, 17, 18, 20, 21, and 23. At least a portion of the first and second plungers 1140 and 2450 can be disposed within the shell 1131. The second plunger 2450 can include a tip portion 2451 that extends outwardly from the shell 1131, and the tip portion 2451 is configured to contact and electrically connect to conductive pads, e.g., on a PCB. The second plunger 2450 can also include a tail portion (not shown) inserted into the shell 1131. The second end of the shell 1131, receives the second plunger 2450, can be crimped to retain the tail portion in the shell 1131 so that the tail portion is slidable within the shell 1131. The tip portion 2451 extends outwardly from the shell 1131 away from the tail portion.

A spring (not shown) can be disposed between the two plungers 1140 and 2450. The spring can be capable of exerting a force against each plunger 1140 and 2450 to bias the second plunger 2450 outwardly from the shell 1131 and away from the first plunger 1140. The second plunger 2450 can also be depressed inwardly into the shell 1131 under a force directed inward against the spring. Thus, the first plunger 1140 is connected to the shell 1131 to move with the shell 1131, and the second plunger 2450 is slidable with respect to the shell 1131.

In the embodiment depicted in FIG. 24, the insulation member 1170, which is described above and shown in FIGS. 11-13, can be connected to the first plunger 1140. Alternatively, an insulation member could be connected to the shell 1131 or both the shell 1131 and the first plunger 1140. Alternatively, or in addition, the insulation member 1770 (FIG. 17) can be connected to the first plunger 1140 and/or to the shell 1131, and/or the insulation member(s) 1870 (FIGS. 18-23) can be connected to the shell 1131. The first plunger 1140 can be substituted by the first plunger 1840 described above and shown in FIGS. 18-20, or the first plunger 2140 described above and shown in FIGS. 21-23.

In an exemplary embodiment, an insulation member 2470 can be connected to the second plunger 2450. The insulation member 2470 can be generally similar in size, shape, and materials as the insulation member 1170 (FIG. 11-13) or 1770 (FIG. 17) described above, except that the insulation member 2470 is located on the second plunger 2450 instead of the first plunger 1140.

FIG. 25 shows a cross-section of the insulation member 2470. Similar to the insulation member 1170 (FIG. 11-13) or 1770 (FIG. 17) described above, the insulation member 2470 can include a through-hole or opening 2571 configured to allow the insulation member 2470 to be disposed on the second plunger 2140. In the exemplary embodiment, the insulation member 2470 is disposed on an outer surface of the tip portion 2451 of the second plunger 2450. The tip portion 2451 can include a narrowed section 2554 on the outer surface thereof for positioning and receiving the insulation member 2470. The narrowed section 2554 can be similar to the narrowed section 1244 described above and shown in FIG. 12. To position the insulation member 2470 on the tip portion 2451 of the second plunger 2450, the free end of the tip portion 2451 (opposite the tail portion) can be inserted through the opening 2571 in the insulation member 2470 until the insulation member 2470 is seated in the narrowed section 2554. Instead of (or in addition to) providing the narrowed section 2554 for holding the insulation member 2470 in place, the insulation member 2470 can be held in position due to a compression fit of the insulation member 2470 on the outer surface of the second plunger 2450, as described above in connection with the insulation member 1170 positioned on the first plunger 1140 and/or the shell 1131.

FIG. 26 shows the contact probe 2430 positioned in a socket assembly similar to the socket assembly described above in connection with FIGS. 13 and 14 (e.g., including the socket body 1320 and the socket retainer 1324) to form an electrical connector assembly. Alternatively, the contact probe 1830 can be positioned in a socket assembly similar to the socket assembly described above in connection with FIGS. 15 and 16 (e.g., including the top socket layer 1520, the center socket layer 1522, and the bottom socket layer 1524) to form an electrical connector assembly. The first plunger 1140, the shell 1131, and the insulation member 1170 can move up and down (axially) with respect to the second plunger 2450 and the insulation member 2470 due to external axial forces acting on the first plunger 1140 (e.g., via contact with a DUT, such as the IC chip 1410 (FIGS. 14-16)). Likewise, the second plunger 2450 and the insulation member 2470 can move up and down (axially) with respect to the first plunger 1140, the shell 1131, and the insulation member 1170 due to external axial forces acting on the second plunger 2450 (e.g., via contact with a PCB).

The insulation member 2470 can be located in the cavity 1325 in the socket retainer 1324 (or the cavity 1525 in the bottom socket layer 1542) when the contact probe 2430 is positioned in the socket assembly. As any of these components (e.g., the first plunger 1140, the shell 1131, and the insulation member 1170 together, the second plunger 2450 and the insulation member 2470 together, etc.) of the contact probe 1130 move, the insulation members 1170 and 2470 hold the contact probe 2430 substantially straight and in alignment in the socket assembly (e.g., the socket body 1320 and the socket retainer 1324; or the top socket layer 1520, the center socket layer 1522, and the bottom socket layer 1524).

Accordingly, in the various embodiments, the contact probe 1130, 1730, 1830, 2130, or 2430 can include one or more insulation members 1170, 1770, 1870, and/or 2470 located on the first plunger 1140, the shell 1131 or 2131, and/or the second plunger 2450. The insulation members 1170, 1770, 1870, and/or 2470 hold the respective contact probe 1130, 1730, 1830, 2130, or 2430 in position in the socket assembly (e.g., the socket body 1320 and the socket retainer 1324; or the top socket layer 1520, the center socket layer 1522, and the bottom socket layer 1524). As a result, tilting of the contact probe 1130, 1730, 1830, 2130, or 2430 in the socket assembly can be reduced or prevented. Also, contact between the contact probe 1130, 1730, 1830, 2130, or 2430 and the socket assembly (e.g., the socket body 1320 and the socket retainer 1324; or the top socket layer 1520, the center socket layer 1522, and the bottom socket layer 1524)

can be reduced or prevented. Thus, while electrical current is transmitted through the contact probe 1130, 1730, 1830, 2130, or 2430 (e.g., the shell, the first plunger, and the second plunger), the insulation members 1170, 1770, 1870, and/or 2470 can prevent an electrical short between the contact probe 1130, 1730, 1830, 2130, or 2430 and the socket assembly (e.g., the socket body 1320 and the socket retainer 1324; or the top socket layer 1520, the center socket layer 1522, and the bottom socket layer 1524). Even if the socket assembly includes a layer of insulative material separating the contact probe 1130, 1730, 1830, 2130, or 2430 from the portions of the socket assembly that are formed from conductive material, the insulation members 1170, 1770, 1870, and/or 2470 can prevent an electrical short if any breaks are formed in the insulative layer.

The insulation members 1170, 1770, and/or 2470 provided on the first plunger 1140 and/or the second plunger 2450 can also be larger than the respective openings in the socket assembly (e.g., the socket body 1320 and the socket retainer 1324; or the top socket layer 1520, the center socket layer 1522, and the bottom socket layer 1524) through which the tip portions 1141 and/or 2451 of the respective plungers 1140 and/or 2450 extend. As a result, the plungers 1140 and/or 2450 can be prevented from inadvertently passing through openings in the socket assembly.

The insulation member 1170, 1770, 1870, and/or 2470 can have an outer surface having a peripheral dimension (e.g., an outer diameter) that is greater than a peripheral dimension (e.g., outer diameter) of an outer surface of the first plunger 1140, the shell 1131 or 2131, and/or the second plunger 2450 to which the insulation member 1170, 1770, 1870, and/or 2470 is attached. In an embodiment, the outer diameter of the insulation member 1170, 1770, 1870, and/or 2470 can be approximately 0.6 millimeters and the outer diameter of the outer surface of the shell 1131 or 2131 can be approximately 0.3 millimeters. The outer diameter of the insulation member 1170, 1770, 1870, and/or 2470 can be at least approximately twice as large as the outer diameter of the first plunger 1140 (e.g., narrowed or non-narrowed sections of the tip portions), the shell 1131 or 2131, and/or the second plunger 2450 (e.g., narrowed or non-narrowed sections of the tip portions). Alternatively, the outer diameter of the insulation member 1170, 1770, 1870, and/or 2470 can be at least 25%, 50%, or 75% larger than the outer diameter of the first plunger 1140 (e.g., narrowed or non-narrowed sections of the tip portions), the shell 1131 or 2131, and/or the second plunger 2450 (e.g., narrowed or non-narrowed sections of the tip portions). The insulation member 1170, 1770, 1870, and/or 2470 can have a cross section that spans at least a majority of an area between the socket assembly and the outer diameter of the first plunger 1140 (e.g., narrowed or non-narrowed sections of the tip portions), the shell 1131 or 2131, and/or the second plunger 2450 (e.g., narrowed or non-narrowed sections of the tip portions). The dimensions of the insulation member 1170, 1770, 1870, and/or 2470 and the first plunger 1140 (e.g., narrowed or non-narrowed sections of the tip portions), the shell 1131 or 2131, and/or the second plunger 2450 (e.g., narrowed or non-narrowed sections of the tip portions) can be determined based on the desired coaxial structure of the test system. For example, an impedance provided by a coaxial structure can be controlled by providing a desired ratio between a diameter D3 as shown in FIG. 13 of the inner surface of the cavities 1321 of the socket body 1320 (or a diameter D5 (FIG. 15) of the inner surface of the cavity 1523 of the center socket layer 1522 of FIGS. 15 and 16, depending on the type of socket assembly) and a diameter D4 of the outer surface of the shell 1131 of the contact probe 1130, 1730, 1830, or 2430 (or shell 2131 of the contact probe 2130) (e.g., the ratio D3/D4 or D5/D4).

It will be apparent to those skilled in the art that various modifications and variations can be made in the disclosed systems and processes without departing from the scope of the disclosure. That is, other embodiments will be apparent to those skilled in the art from consideration of the specification and practice of the disclosure. It is intended that the specification and examples be considered as exemplary only, with a true scope being indicated by the following claims and their equivalents.

What is claimed is:

1. A contact probe comprising:

a shell comprising a body having a shell cavity;

at least one plunger received in the shell cavity and extending through at least one opening in at least one end of the shell; and at least one insulation member comprising an insulative material, an outer surface of at least one of the shell and the at least one plunger is configured to exhibit a narrowed region about at least a portion of a periphery thereof bounded by at lqast one non-narrowed region about the periphery thereof, the narrowed region and the at least one non-narrowed region being configured such that the at least one insulation member is received about and seated in the narrowed region.

2. The contact probe of claim 1, wherein the at least one insulation member is configured to surround at least a majority of a periphery of the portion of the outer surface.

3. The contact probe of claim 1, wherein the at least one insulation member is disposed on at least a portion of an outer surface of the shell.

4. The contact probe of claim 1, wherein:

the at least one plunger includes a tail portion that is slidably received in the shell cavity and a tip portion extending through the at least one opening in the at least one end of the shell, the at least one insulation member is disposed on at least a portion of an outer surface of the tip portion.

5. The contact probe of claim 1, wherein the at least one insulation member forms a ring.

6. The contact probe of claim 5, wherein the ring is configured to fit by compression onto at least the portion of the outer surface.

7. The contact probe of claim 5, wherein the ring is configured to couple with the narrowed region.

8. The contact probe of claim 7, wherein the narrowed region exhibits a generally U-shaped cross section.

9. The contact probe of claim 1, wherein:

the at least one end of the shell includes a first end and a second end;

the at least one opening includes a first opening in the first end and a second opening in the second end; and the at least one plunger includes a first plunger extending through the first opening and a second plunger extending through the second opening.

10. The contact probe of claim 9, wherein:

the at least one insulation member contacts at least one of: the first plunger and the first end of the shell, and the at least one insulation member is configured to move with the first plunger and the shell.

11. The contact probe of claim 9, wherein the at least one insulation member is fixedly disposed on the first plunger.

12. The contact probe of claim 9, wherein the first plunger is attached to the shell so that the first plunger and the shell move together when an axial force is applied to the first plunger.

13. The contact probe of claim 9, wherein the at least one insulation member includes a first insulation member disposed on a first portion of the outer surface of the shell and a second insulation member disposed on a second portion of the outer surface of the shell.

14. The contact probe of claim 13, wherein the first plunger is attached to the shell so that the first and second insulation members, the first plunger, and the shell are configured to move together.

15. The contact probe of claim 13, wherein the first plunger is configured to move independently from the first and second insulation members and the shell.

16. The contact probe of claim 13, wherein the first portion of the outer surface of the shell is located near the first end of the shell, and the second portion of the outer surface of the shell is located near the second end of the shell.

17. The contact probe of claim 9, wherein the at least one insulation member is fixedly disposed on the second plunger.

18. The contact probe of claim 1, wherein the shell and the at least one plunger each comprise at least one conductive material, and are configured to be electrically connected.

19. The contact probe of claim 1, wherein the insulative material includes polytetrafluoroethylene.

20. The contact probe of claim 1, wherein an outer diameter of the insulation member is at least approximately twice as large as an outer diameter of the shell.

21. An electrical connector assembly comprising:

a socket shell comprising a body having a socket cavity; and a contact probe comprising:

a contact probe shell disposed in the socket cavity, the contact probe shell comprising a body having a shell cavity;

at least one plunger received in the shell cavity and extending through at least one opening in at least one end of the contact probe shell; and at least one insulation member comprising an insulative material and disposed in the socket cavity, the at least one insulation member being disposed on and fixed to at least a portion of an outer surface of the at least one plunger.

22. The electrical connector assembly of claim 21, wherein the at least one insulation member has a cross section that spans at least a majority of an area between a portion of the socket shell and the portion of the outer surface.

23. The electrical connector assembly of claim 21, wherein at least a portion of the socket shell, the contact probe shell, and the at least one plunger each comprise at least one conductive material.

24. The electrical connector assembly of claim 23, wherein the socket shell includes a top portion comprising a second insulative material, an intermediate portion comprising a second conductive material, and a bottom portion comprising a third insulative material.

25. The electrical connector assembly of claim 24, wherein the second insulative material and the third insulative material each include plastic.

26. The electrical connector assembly of claim 21, wherein the socket shell body includes at least a top portion and a bottom portion, the socket cavity extending through the top portion and the bottom portion.

27. The electrical connector assembly of claim 26, wherein:

the at least one plunger includes a first plunger that extends through a first opening in the top portion of the socket shell body and a second plunger that extends through a second opening in the bottom portion of the socket shell body.

28. The electrical connector assembly of claim 27, wherein:

the electrical connector is configured to provide an electrical connection between an integrated circuit chip and a printed circuit board via the contact probe;

the first plunger is configured to provide an electrical contact to the integrated circuit chip; and the second plunger is configured to provide an electrical contact to the printed circuit board.

29. The electrical connector assembly of claim 27, wherein the at least one insulation member includes an insulation member disposed on the first plunger.

30. The electrical connector assembly of claim 27, wherein the at least one insulation member includes an insulation member disposed on the second plunger.

31. The electrical connector assembly of claim 30, wherein the insulation member disposed on the second plunger is located near the bottom portion of the socket shell body.

32. The electrical connector assembly of claim 27, wherein:

the first end of the shell is proximal to the first plunger and a second end of the shell is proximal to the second plunger, and the at least one insulation member includes a first insulation member disposed on the shell near the first end and a second insulation member disposed on the shell near the second end.

33. The electrical connector assembly of claim 21, further comprising:

a plurality of contact probes:

wherein the socket shell body comprises a plurality of socket cavities, each associated with at least one of the plurality of contact probes.

34. The electrical connector assembly of claim 33, wherein the electrical connector is configured to provide an electrical connection between an integrated circuit chip and a printed circuit board via the plurality of contact probes.

35. A method of forming an electrical connector with a coaxial structure, the method comprising:

forming a contact probe by:

inserting at least one plunger into a shell cavity in a body of a shell so that a tail portion of the at least one plunger is slidably received in the shell cavity and a tip portion of the at least one plunger extends away from the shell cavity, and disposing a first insulation member on a first portion of an outer surface of the shell and a second insulation member on second portion of the outer surface of the shell, wherein the second portion of the outer surface of the shell is displaced from the first portion of the outer surface of the shell such that a gap extends between the first insulation member and the second insulation member along an axis of the body of the shell, each of the first and second insulation members comprising an insulative material;

disposing the contact probe in a first socket cavity in a first portion of a socket assembly so that at least a portion of each of the first and second insulation members and the gap therebetween is disposed within the first socket cavity; and disposing a second portion of the socket assembly with a second socket cavity adjacent the first portion of the socket assembly so that the first socket cavity is aligned with the second socket cavity, and the first portion of the socket assembly, the second portion of the socket assembly, and the contact probe form the coaxial structure.

36. The method of claim 35, wherein at least one of the first and second insulation members includes at least one ring that is configured to fit by compression onto the corresponding first or second portion of the outer surface of the shell; and the method further comprising pushing the at least one ring from at least one end of the shell to a desired location.

37. The method of claim 35, wherein the first portion of the outer surface of the shell includes a narrowed section.

38. The method of claim 35, wherein the first portion of the outer surface of the shell is located near a first end of the shell and the second portion of the outer surface of the shell is located near a second end of the shell.

39. The method of claim 35, wherein each of the first and second insulation members surrounds at least a majority of a periphery of the respective first and second portions of the outer surface of the shell.

40. The method of claim 35, wherein the shell and the at least one plunger each comprise at least one conductive material, and are configured to be electrically connected.

41. The method of claim 35, wherein:

the first and second portions of the socket assembly are configured to limit sliding movement of the contact probe.

42. The method of claim 41, wherein:

the first socket cavity is one of a plurality of first socket cavities in the first portion of the socket assembly;

the contact probe is one of a plurality of contact probes, each contact probe being disposed in a respective first socket cavity;

the second socket cavity is one of a plurality of second socket cavities in the second portion of the socket assembly; and the plurality of first socket cavities are aligned with the respective plurality of second socket cavities.

43. The method of claim 35, wherein the first insulation member in its entirety, the second insulation member in its entirety, and the gap therebetween in its entirety is disposed within the first socket cavity.

* * * * *

UNITED STATES PATENT AND TRADEMARK OFFICE

CERTIFICATE OF CORRECTION

PATENT NO. : 8,758,066 B2
APPLICATION NO. : 13/365931
DATED : June 24, 2014
INVENTOR(S) : Jiachun Zhou et al.

It is certified that error appears in the above-identified patent and that said Letters Patent is hereby corrected as shown below:

In the Claims:

In claim 1, column 14, line 25, "lqast" should read --least--.

In claim 33, column 16, line 37, "probes:" should read --probes;--.

In claim 35, column 16, line 55, "on second portion" should read --on a second portion--.

Signed and Sealed this
Thirtieth Day of September, 2014

Michelle K. Lee

Michelle K. Lee
*Deputy Director of the United States Patent and Trademark Office*